US012560661B2

(12) United States Patent
Ding et al.

(10) Patent No.: US 12,560,661 B2
(45) Date of Patent: Feb. 24, 2026

(54) MAGNETIC CURRENT SENSOR CALIBRATION

(71) Applicant: Texas Instruments Incorporated, Dallas, TX (US)

(72) Inventors: Lei Ding, Plano, TX (US); Elie Libbos, Champaign, IL (US); Srinath Ramaswamy, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 45 days.

(21) Appl. No.: 18/326,658

(22) Filed: May 31, 2023

(65) Prior Publication Data

US 2024/0110999 A1      Apr. 4, 2024

Related U.S. Application Data

(60) Provisional application No. 63/410,395, filed on Sep. 27, 2022.

(51) Int. Cl.
G01R 33/00 (2006.01)
G01R 33/09 (2006.01)

(52) U.S. Cl.
CPC ..... G01R 33/0035 (2013.01); G01R 33/0017 (2013.01); G01R 33/09 (2013.01)

(58) Field of Classification Search
CPC . G01R 33/0035; G01R 33/0017; G01R 33/09
See application file for complete search history.

(56) References Cited

U.S. PATENT DOCUMENTS

| | | | |
|---|---|---|---|
| 10,598,700 B2 * | 3/2020 | Polley | G01R 15/148 |
| 2012/0001617 A1 * | 1/2012 | Reynolds | G01R 15/18 |
| | | | 324/74 |
| 2018/0188071 A1 * | 7/2018 | Reidl | G01D 3/024 |
| 2018/0238938 A1 * | 8/2018 | Feucht | G01R 15/202 |
| 2022/0065900 A1 * | 3/2022 | Ding | G01R 19/10 |
| 2023/0052689 A1 | 2/2023 | Ding et al. | |

OTHER PUBLICATIONS

"Clarke & Park Transforms on the TMS320C2xx", Texas Instruments, 1997, 46 pages.

* cited by examiner

*Primary Examiner* — Alvaro E Fortich
(74) *Attorney, Agent, or Firm* — Zhenhai Fu; Frank D. Cimino

(57) ABSTRACT

In one example, a calibration method includes receiving, from a sensor proximate a first conductor, a sensor signal representing a measurement of a magnetic field produced based on a first current flowing in the first conductor and a second current flowing in a second conductor, the first current including first and second current components having different frequencies, and the second current including third and fourth current components, the third current component phase shifted from, and having the same frequency as, the first current component and the fourth current component having a different frequency from the third current component, determining reference values of the first and second currents, and based on the sensor signal and the reference values of the first and second currents, determining for the sensor, a plurality of coupling coefficients representing magnetic field coupling between the first and second conductors.

12 Claims, 13 Drawing Sheets

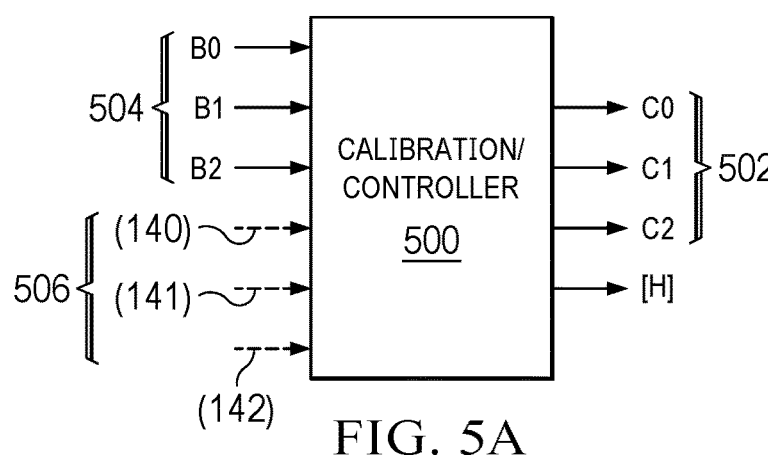
FIG. 5A
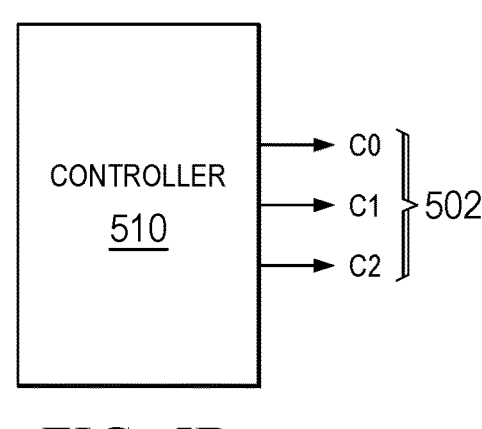
FIG. 5B
FIG. 5C

600

602 — CURRENTS FLOWING IN CONDUCTORS

604 — INJECT ZERO SEQUENCE
CURRENT SIGNAL(S)

606 — ACQUIRE SENSOR MEASUREMENTS

608 — DETERMINE REFERENCE
VALUES OF CURRENTS

610 — CALCULATE COUPLING COEFFICIENTS

612 — PROVIDE CALIBRATED COUPLING
COEFFICIENTS TO SENSOR(S)

702

1200

MAGNETIC CURRENT SENSOR CALIBRATION

CROSS-REFERENCE TO RELATED APPLICATION

This application claims the benefit of and priority to U.S. Provisional Patent Application No. 63/410,395 filed Sep. 27, 2022, which is incorporated herein by reference in its entirety.

TECHNICAL FIELD

This description relates to current sensing, and more particularly to techniques for magnetic current sensor calibration.

BACKGROUND

Current sensing is used in many applications. One way of performing current sensing includes using a magnetic sensor to measure a magnetic field generated by a current in a conductor, and converting the magnetic field measurement to a current measurement. Some magnetic sensors comprise a magnetic core (or shield) which encircles the conductor and provides shielding of magnetic fields generated by neighboring conductors which can otherwise result in undesirable magnetic coupling/interference. However, the magnetic cores add cost, weight, and other mechanical constraints to the system design. Accordingly, in some applications it is desirable to use magnetic sensors for current sensing that do not require the magnetic cores/shields. To provide accurate current sensing that accounts for interference from neighboring conductors, a calibration operation can be performed to characterize the interference between conductors. However, there can be challenges associated with such calibration operations.

SUMMARY

In an example, a method comprises receiving, from a sensor proximate a first conductor, a sensor signal representing a measurement of a magnetic field produced based on a first current flowing in the first conductor and a second current flowing in a second conductor, the first current including a first current component having a particular frequency and a second current component having a different frequency from the first current component, and the second current including a third current component having the particular frequency and phase shifted from the first current component and a fourth current component having a different frequency from the third current component, determining a reference value of the first current, determining a reference value of the second current, and based on the sensor signal and the reference values of the first and second currents, determining for the sensor, a plurality of coupling coefficients representing magnetic field coupling between the first and second conductors.

In another example, an apparatus comprises an inverter having a current terminal and at least one control terminal, a sensor module including at least one sensor and configured to provide a sensor signal representative of a measurement of a magnetic field produced based on multi-phase current signals present at the current terminal, and a controller having a voltage sensing input, a current sensing input coupled to the sensor module, and a control output coupled to the at least one control terminal. The controller is configured to determine a voltage angle based on voltage measurements received at the voltage sensing input, receive, at the current sensing input, the sensor signal, and provide, based on the voltage angle and a reference measurement of the multi-phase current signals, a pulse width modulation (PWM) control signal at the control output to control the inverter to produce a calibration current signal at the current terminal, the calibration current signal having a first frequency, wherein the multi-phase current signals include a combination of multi-phase drive currents and the calibration current, the multi-phase drive currents having a second frequency different from the first frequency.

In another example, an apparatus comprises a sensor having a sensor output and configured to provide a sensor signal at the sensor output; and a calibration controller having a sensor input coupled to the sensor output, a data input, and a control output, the calibration controller configured to receive the sensor signal via the sensor input, receive, at the data input, data representing a measurement of the first calibration current and a measurement of the second calibration current, determine, based on the sensor signal and the measurements of the first and second calibration currents, a plurality of coupling coefficients for the sensor, and provide, at the control output, data representing the plurality of coupling coefficients.

In another example, a computer program product includes one or more non-transitory machine-readable mediums encoded with instructions that when executed by one or more processors cause the one or more processors to receive data corresponding to a sensor signal from a sensor proximate a first conductor, the sensor signal representing a measurement of a magnetic field produced based on a first current flowing in the first conductor and a second current flowing in a second conductor, the first current including a first current component having a particular frequency and a second current component having a different frequency from the first current component, and the second current including a third current component having the particular frequency and phase shifted from the first current component and a fourth current component having a different frequency from the third current component, determine a reference value of the first current, determine a reference value of the second current; and based on the sensor signal and the reference values of the first and second currents, determine for the sensor, a plurality of coupling coefficients representing magnetic field coupling between the sensor and the first and second conductors.

BRIEF DESCRIPTION OF THE DRAWINGS

FIG. 5A is a schematic diagram of a controller with an integrated calibration module that can interface with the inverter system and current sensor packages of FIG. 4, according to some examples.

FIG. 5B is a schematic diagram of a controller that can interface with the inverter system, according to some examples.

FIG. 5C is a schematic diagram of a calibration module that can interface with or be part of the current sensor packages of FIG. 4, according to some examples.

DETAILED DESCRIPTION

Figure 1:
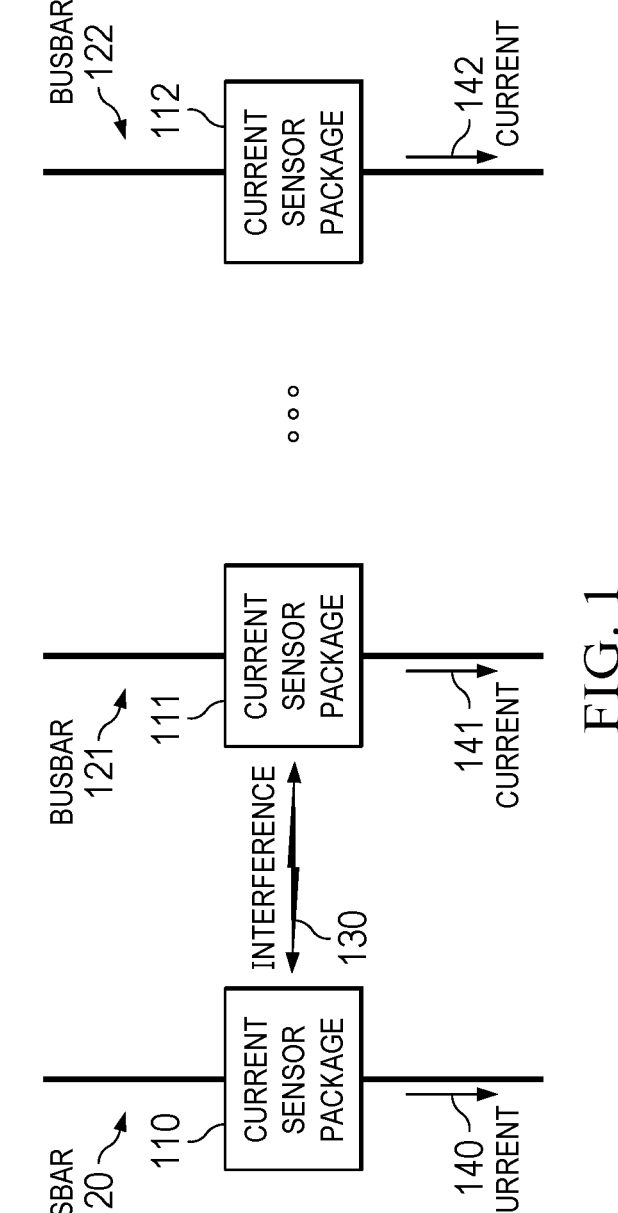
FIG. 1 is a schematic diagram illustrating a current measurement system, according to some examples.

Current sensor calibration techniques are described. In one example, a calibration method includes receiving, from a sensor proximate a first conductor, a sensor signal. The sensor signal represents a measurement of a magnetic field produced based on a first current flowing in the first conductor and a second current flowing in a second conductor. The first current includes first and second current components having different frequencies. The second current includes third and fourth current components, the third current component phase shifted from, and having the same frequency as, the first current component. The fourth current component has a different frequency from the third current component. The calibration method continues with determining reference values of the first and second currents, and based on the sensor signal and the reference values of the first and second currents, determining for the sensor, a plurality of coupling coefficients representing magnetic field coupling between the first and second conductors. The techniques may also be performed by, for example, a calibration system or apparatus, a controller that include or works in conjunction with one or more sensors, or a sensor that includes that calibration system.

The calibration operation as described herein allows driving multiple conductors with multi-phase currents simultaneously, so that a magnetic field measured by a sensor proximate a conductor can include a desired component generated by the current that flows on that conductor and interference components caused by other currents on other conductors. The coupling coefficients can then be generated from the magnetic fields measurements. Compared with a case where a single-phase current is driven through each conductor at a time while no current flows on other conductors including the conductor that proximate the sensor, and using that sensor to measure an interference magnetic field generated only by that single-phase current, the calibration operation as described herein can improve the efficiency of the calibration operation. The calibration operation as described herein can also reduce inaccuracies caused by, for example, operating multi-phase power systems with single-phase currents, reconfiguration of the system hardware prior to driving each individual single-phase current on each conductor, etc. Also, the second and fourth current components can be introduced as zero sequence alternating current (AC) signal to change the correlation between the multi-phase currents, which allows determination of the magnetic coupling coefficients from measurements of the simultaneous multi-phase currents. The zero sequence current signal can be added in various ways, examples of which are described below. All these can improve the efficiency and accuracy of the calibration operation.

The techniques described herein are useful in a wide variety of applications, such as traction inverters and other multi-phase power systems where current measurement is required or otherwise useful. The described techniques are useful for any systems that include multiple conductors that are routed in relative proximity, where magnetic field interference is possible, and for which accurate current measurements are desired.

FIG. 1 illustrates an example current measurement system 100 to measure currents in busbar conductors. The busbar conductors may be part of a multi-phase power system, including a traction inverter or other type of inverter. A number of busbars 120, 121, 122 are shown in which conductor currents 140, 141, and 142 respectively, are flowing. The busbars can be any type of conductor including wire, cable, or other conductive material fabricated in any suitable form factor. Current sensor packages 110, 111, and 112 can be any number of integrated circuit packages configured to contain one or more dies (e.g., wide body multi-die packages configured with I/O pins or pads that couple to a printed circuit board or substrate), and are shown to be disposed or otherwise placed in close proximity to the respective busbars 120, 121, 122. Any number of busbars and associated current sensor packages may be employed. The current flowing through each busbar generates a magnetic field which can be measured by sensors in the associated current sensor package. For example, current sensor package 110 can generate a measurement of current 140 by measuring a magnetic field generated by current 140, current sensor package 111 can generate a measurement of current 141 by measuring a magnetic field generated by current 141, and current sensor package 112 can generate a measurement of current 142 by measuring a magnetic field generated by current 142. If busbars have relatively close proximity to each other, then an interference component 130 generated by the magnetic field from one busbar can be sensed by the current sensor package of one or more adjacent busbars. For example, the magnetic field measured by current sensor package 110 can include a desired component generated by current 140, and an interference component generated by other currents on other conductors, such as interference component 130 generated by current 141 on conductor 121. The calibration techniques described herein include characterization of the coupling coefficients that describe such interference component 130, as well as other interference components. Based on the coupling coefficients, current sensor package 110 can extract the desired component by removing the interference components, and can generate a measurement of current 140 from the desired component to preserve accuracy of the current estimate for conductor 120, notwithstanding the magnetic interference.

Figure 2:
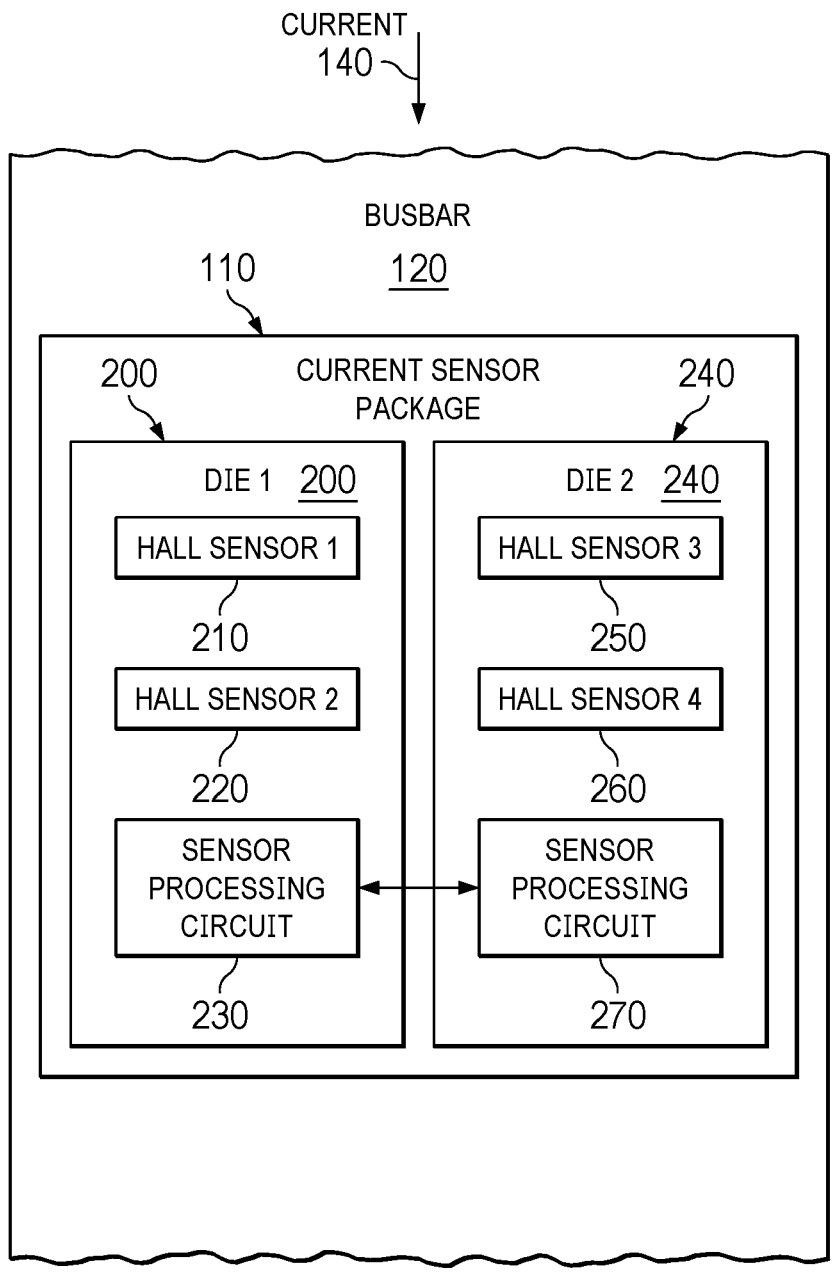
FIG. 2 is a schematic diagram of a current sensor package, according to some examples.

FIG. 2 is a schematic diagram illustrating internal components of the current sensor package 110 of FIG. 1, according to some examples. FIG. 2 also illustrates busbar 120 that is proximate current sensor package 110. Referring to FIG. 2, the package 110 can include two integrate circuits (ICs) or dies 200 and 240. A first die 200 includes a first Hall effect sensor 210, a second Hall effect sensor 220, and a first sensor processing circuit 230. A second die 240 is shown to include a third Hall effect sensor 250, a fourth Hall effect sensor 260, and a second sensor processing circuit 230. The dies and the busbar are not drawn to scale. The sensors are configured to measure magnetic fields. The magnetic fields may include components generated by the current 140 flowing in busbar 120 to be measured by the sensors (desired components), and interference components (e.g., the interference component 130) generated by currents flowing in other busbars, such as busbars 121 and 122. The sensors may be oriented or otherwise configured to sense magnetic fields in different directions (e.g., in the plane of the busbar versus perpendicular to the plane of the busbar).

The sensor processing circuits 230 and 270 are configured to generate a measurement of the current flow through busbar 120 by calculating a weighted sum of the measurements provided by the sensors 210, 220, 250, and 260. In some examples, the weighting factors are based on calibrated coupling coefficients that are determined during a calibration operation, as described below, to reduce the effect of interference 130 from other busbars on the current measurement. The weighting factors may also be varied based on the frequency and amplitude of the sensor output and on the temperature of the sensor, to further improve accuracy.

In the example shown in FIG. 2, the current sensor package 110 includes two dies 200, 204, each of which includes two Hall effect sensors 210, 220, 250, 260. In other examples, the current sensor package may include more or fewer than 2 dies and each die may include more or fewer than two Hall effect sensors. In some examples, the current sensor package 110 may include a single die 200. In some examples, the current sensor package 110 may include additional dies and/or additional Hall effect sensors, for example depending on form factor requirements and other design constraints. In some examples, the sensors may be configured to sense magnetic fields in any desired direction, including two or more sensors sensing magnetic fields in the same direction. In some examples, additional sensor packages may be employed to measure a current on a busbar such that any number of dies can be included in the different sensor packages. Further, although the sensors shown in the example of FIG. 2 are Hall effect sensors, in other examples, other types of magnetic field sensors, such as Tunnel Magneto-Resistance effect (TMR effect) sensors, Anisotropic Magnet Resistance effect (AMR effect) sensor, Giant magnetoresistance (GMR), for example, can be used.

Figure 3:
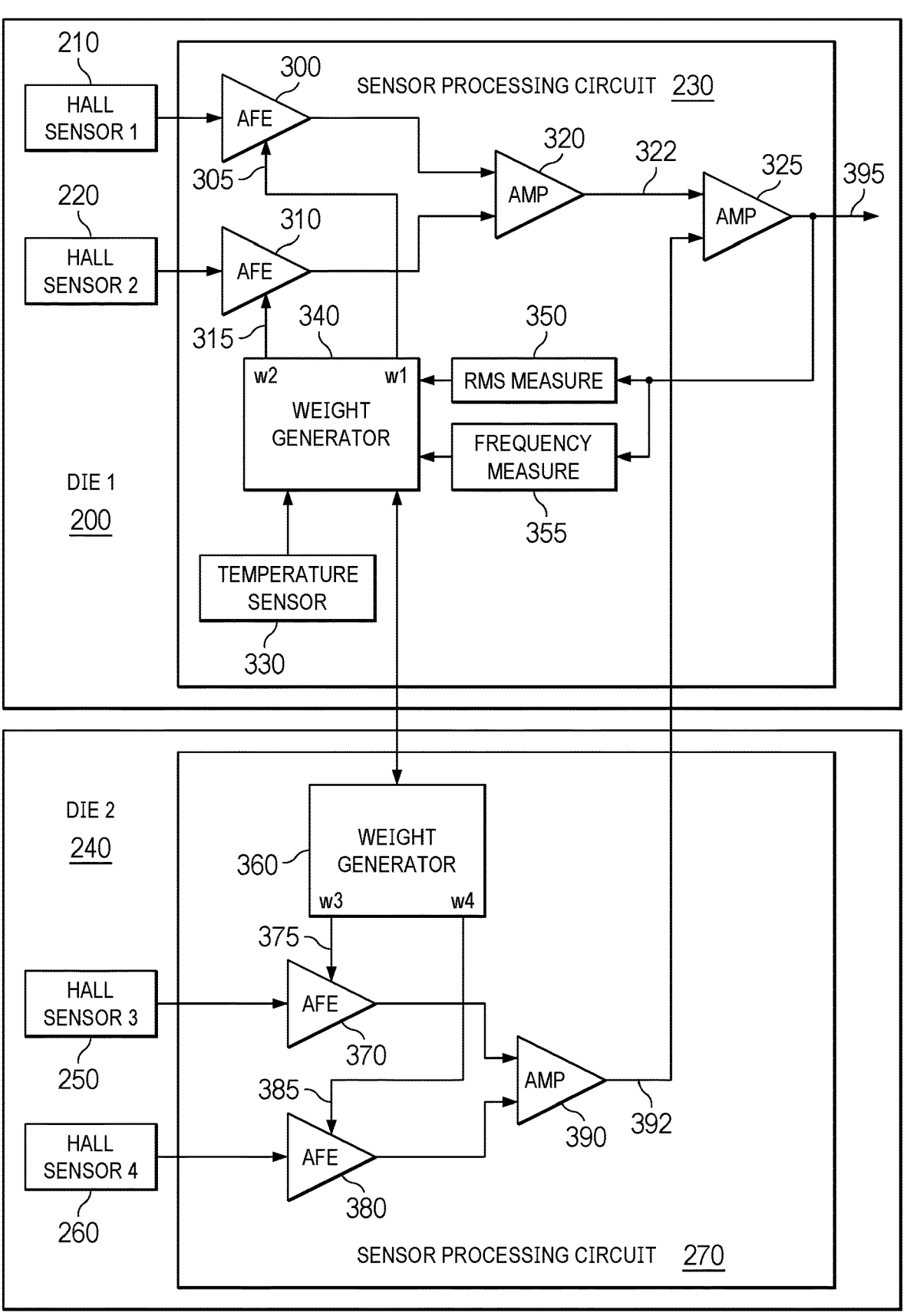
FIG. 3 is a schematic diagram of internal components of the current sensor package of FIG. 1, according to some examples.

FIG. 3 is a schematic diagram illustrating internal components of the dies 200 and 240 of the current sensor package 110, according to some examples. The first die 200 includes the first Hall effect sensor 210, the second Hall effect sensor 220, and the sensor processing circuit 230. The sensor processing circuit 230 includes a first analog front end (AFE) 300, a second AFE 310, summing amplifiers 320 and 325, weight generator 340, RMS measurement circuit 350, frequency measurement circuit 355, and temperature sensor 330.

The first Hall effect sensor 210 is configured to generate a first measurement signal of a magnetic field generated by a current flowing through the conductor 120. For example, the measurement signal may be a voltage that is proportional to the magnetic field. The second Hall effect sensor 220 is configured to generate a second measurement signal of the magnetic field generated by the current flowing through conductor 120. In some examples, the first and second sensors may be configured to measure components of the magnetic field that are orthogonal to each other. For example, the first sensor may measure a component of the magnetic field that is in the plane of the busbar while the second sensor may measure a component of the magnetic field that is perpendicular to the plane of the busbar, although other orientations are possible.

AFE 300 includes an amplifier circuit and is configured to amplify the first measurement signal based on a first amplification weighting factor w1 305. Also, AFE 310 includes an amplifier circuit and is configured to amplify the second measurement signal based on a second amplification weighting factor w2 315. AFEs 300 and 310 may also provide any other suitable analog front end functionality (e.g., filtering).

Summing amplifier 320 is configured to sum the outputs of AFE 300 and AFE 310 to generate a first measurement 322 of the current flowing through the conductor.

Root mean square (RMS) measurement circuit 350 is configured to generate an RMS value of an amplitude of the current in the conductor.

Frequency measurement circuit 355 is configured to generate a frequency estimate of the measured current from a measurement signal 395.

Temperature sensor 330 is configured to generate a temperature estimate of the die 200.

Weight generator 340 is configured to generate the first weighting factor w1 and the second weighting factor w2 based on the frequency estimate, the RMS value, and the temperature estimate. In some examples, the weighting factors may be determined from coupling coefficients determined during a prior calibration operation, as described below, and then stored in a lookup table or other memory. The weighting factors and/or coupling coefficients can then be retrieved from the lookup table or memory. In some examples, weight generator 340 is also configured to generate weighting factors for AFEs 370 and 380, included in the second die 240, as described below.

Summing amplifier 325 is configured to sum the first measurement 322 of the current flowing through the conductor with a second measurement 392, provided by the second die 240, as described below, to generate measurement signal 395 representing the current flowing through the conductor. The RMS measurement circuit 350 generates an RMS value of an amplitude of measurement signal 395.

The second die 240 includes the third Hall effect sensor 250, the fourth Hall effect sensor 260, and the sensor processing circuit 270. The sensor processing circuit 270 includes a third AFE 370, a fourth AFE 380, summing amplifier 390, and weight generator 360.

The third Hall effect sensor 250 is configured to generate a third measurement signal of the magnetic field generated by current flowing through the conductor 120, and the fourth Hall effect sensor 260 is configured to generate a fourth measurement signal of the magnetic field generated by the current flowing through the conductor 120. In some examples, the third and fourth sensors may also be configured to make orthogonal measurements, relative to each other, of the magnetic field.

Weight generator 360 is configured to provide the third weighting factor w3 375 and the fourth weighting factor w4 385, for example by communicating with weight generator 340 on die 1 to obtain the weighting factors.

AFE 370 includes an amplifier circuit and is configured to amplify the third measurement signal based on the third weighting factor w3. Similarly, AFE 380 includes an amplifier circuit and is configured to amplify the fourth measurement signal based on a fourth weighting factor w4 385. AFEs 370 and 380 may also provide any other suitable analog front end functionality (e.g., filtering).

Summing amplifier 390 is configured to sum the outputs of AFE 370 and AFE 380 to generate the second measurement 392 of the current flowing through the conductor, which is provided as input back to amplifier 325 on first die 200.

In some examples, weight generators 340 and 360 may be implemented as a processor or a finite state machine.

In some examples, weight generators 340 and 360 may be configured to provide weights 305, 315, 375, and 385, which in turn can set the respective gains of AFEs 300, 310, 370, and 380, to minimize/reduce the effect of interference components on measurement signal 395, so that measurement signal 395 can more accurately represent the current flowing on the conductor that proximate current sensor package 110 (e.g., current 140 on bus bar 120 in FIG. 2). In some examples, weight generators 340 and 360 may be configured to provide default weights, for example during initialization of the system prior to the availability of a frequency estimate, RMS value, or temperature estimate. In some examples, the default weights may be based, in part, on a nominal temperature value and a relatively low frequency (since a traction inverter, for example, may initially provide DC or low frequency current at startup). The default weights may be determined during calibration of the current sensor package 110 (or based on coupling coefficients determined during the calibration operation), and optionally adjusted during operation based on the frequency estimate, the RMS value, and the temperature estimate, as described above.

Thus, in operation, the sensor package 110 generates measurements of the current flowing in the conductor 120 based on measurements of the magnetic field produced in the conductor 120, as described above. Also, the sensor packages 111 and 112 generate measurements of the estimated current flowing in the conductors 121, 122, respectively. As described above, in each sensor package, the weighting factors are used to control amplification of the various measurement signals from the sensors to account for the interference 130 that can occur between the conductor at which the current is being measured and nearby conductors. The weighting factors may be based on coupling coefficients that provide an estimate of coupling between the conductor and other conductors, and therefore between each sensor output signal and the current flowing in each of the conductors. These coupling coefficients can be determined for each sensor during a calibration process as described below.

Figure 4:
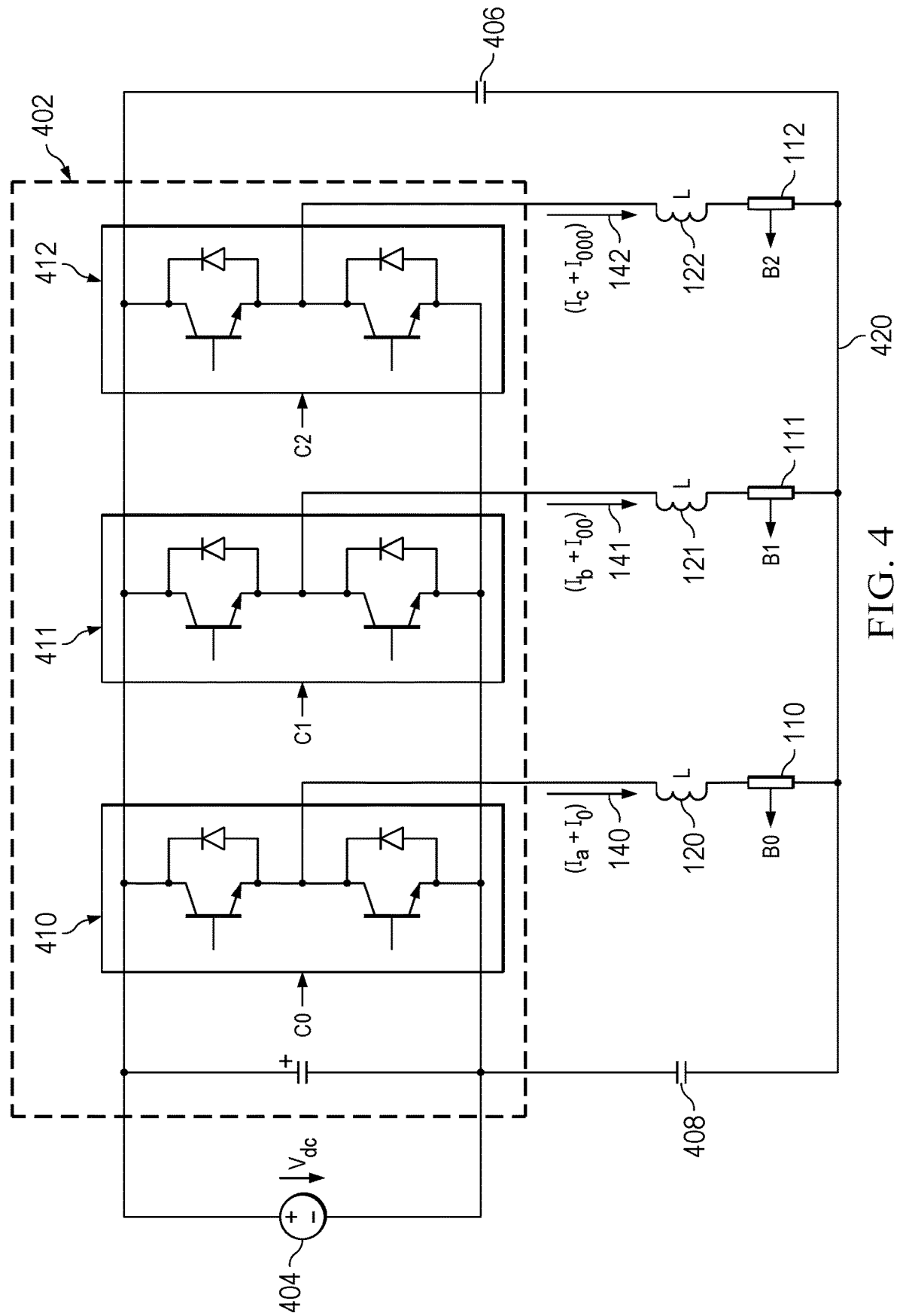
FIG. 4 is a schematic diagram of an inverter system to support calibration of a current sensor, according to some examples.

FIG. 4 illustrates an example of an inverter system in which aspects of sensor calibration techniques disclosed herein may be implemented and in which the current sensor packages 110, 111, 112 may be used. In the illustrated example, an inverter 402 is coupled to a DC voltage supply 404. The inverter 402 is a three-phase inverter, such as a traction inverter, for example, that includes three inverter arms 410, 411, 412 that are respectively individually coupled to the busbar conductors 120, 121, 122, as shown. The three inverter arms 410 are driven according to respective control signals C0, C1, C2, to produce three-phase current components Ia, Ib, and Ic in the respective busbar conductors 120, 121, 122. The three-phase current components Ia, Ib, and Ic have the same frequency, but are offset in phase from one another. Sensor packages 110, 111, 112 are positioned in close proximity to the respective busbar conductors 120, 121, 122, as described above with reference to FIG. 1.

Each current sensor package 110, 111, 112 produces a respective sensor output vector B0, B1, B2, which includes magnetic field measurements from all the magnetic field sensors in the respective current sensor package. For example, for the four sensor current package 110 of FIGS. 2 and 3, the output vector, B0, is given by:

$$B_0 = \begin{bmatrix} b_1 \\ b_2 \\ b_3 \\ b_4 \end{bmatrix} \tag{1}$$

With all three busbar currents 140, 141, 142 flowing simultaneously, the sensor signal output by any one of the magnetic field sensors, for example, $b_1$, is given by:

$$b_1 = I_{ABC} h_1 \tag{2}$$

In Equation (2), $I_{ABC}$ is the matrix of values of the currents 140 ($i_A$), 141 ($i_B$), 142 ($i_C$) flowing in the three busbar conductors and $h_1$ is a vector of coupling coefficients that describe the magnetic field coupling (caused by the currents in each of the three busbar conductors) at the sensor. The coupling coefficients depend on the physical arrangement of the busbar conductors 120, 121, 122 and the arrangement and positioning of the sensor packages 110, 111, 112 (and of the magnetic field sensors within each package) with respect to the conductors.

In Equation (2), for a block of N samples taken over time, $$b_1 = \begin{bmatrix} b_1(1) \\ b_1(2) \\ \vdots \\ b_1(N) \end{bmatrix}; I_{ABC} = \begin{bmatrix} i_A(1) & i_B(1) & i_C(1) \\ i_A(2) & i_B(2) & i_C(2) \\ \vdots & \vdots & \vdots \\ i_A(N) & i_B(N) & i_C(N) \end{bmatrix}; h_1 = \begin{bmatrix} h_{11} \\ h_{12} \\ h_{13} \end{bmatrix}$$

Vectors $b_2$, $b_3$, and $b_4$, and vectors $h_2$, $h_3$, and $h_4$, for the other three sensors in each sensor package 110, 111, 112 have the same form as above. For the block of N samples, given known or measured values of the currents 140, 141, 142 and the sensor signal $b_1$, Equation (2) can be solved for $h_1$ using a least squares method and applying an N-point Fast Fourier Transform (FFT) to extract the coupling coefficients. Thus, $$h_1 = [I_{ABC}^T I_{ABC}]^{-1} I_{ABC}^T b_1 \tag{3}$$

As will be appreciated, given the benefit of this disclosure, Equation (3) can be modified and applied for each sensor in one or more sensor packages to be calibrated. For example, replacing $b_1$ with $b_2$ and making corresponding modifications to $I_{ABC}$ (e.g., using measured reference current samples corresponding to $b_2$) and $h_1$. For the three-phase inverter example, such as illustrated in FIG. 4, there are three coupling coefficients for each sensor, as noted above. For example, where each sensor package 110, 111, 112 includes four magnetic field sensors, a complete vector [H] of all 36 coupling coefficients (three coefficients per each sensor, four sensors per package, and three sensor packages) is given by:

$$[H] = \begin{bmatrix} H_0 \\ H_1 \\ H_2 \end{bmatrix};$$

where $H_0$, $H_1$, and $H_2$ correspond to the coefficients for all the sensors in a respective sensor package, and where each of $H_0$, $H_1$, and $H_2$ is given by:

9

$$[H_x] = \begin{bmatrix} h_1 \\ h_2 \\ h_3 \\ h_4 \end{bmatrix}; x = 1, 2, 3$$

Similarly, a complete vector, [B], for all three sensor packages is represented by:

$$[B] = \begin{bmatrix} B_0 \\ B_1 \\ B_2 \end{bmatrix},$$

with each of $B_0$, $B_1$, and $B_2$ given by Equation (1).

As described above, in a multi-phase power system, such as the three-phase inverter 402 of FIG. 4, for example, the multi-phase currents, Ia, Ib, and Ic flowing in the conductors 120, 121, 122 are perfectly correlated. That is, at an isolated neutral current terminal 420, at any given time, samples of the three current components Ia, Ib, and Ic sum to zero:

$$i_a(n) + i_b(n) + i_c(n) = 0$$

In this circumstance, where the currents 140, 141, 142 include only the perfectly correlated three-phase current components Ia, Ib, and Ic, a least-squares approach may not solve for the coefficients $h_{11}$, $h_{12}$, and $h_{13}$ because the current matrix $I_{ABC}$ is not full rank and therefore its inverse may not be calculated. Accordingly, in this case, Equation (3) may be unable to provide a solution for the coefficient vector $h_1$.

To address this problem, examples of the calibration techniques disclosed herein inject an additional current component, referred to as a zero sequence current, into the busbar conductors to break the perfect correlation of the multi-phase currents. Accordingly, the busbar currents 140, 141, 142 each include the sum of two components: the multi-phase current components, Ia, Ib, Ic, respectively, and the zero sequence current components, $I_0$, $I_{00}$, and $I_{000}$, respectively, as shown in FIG. 4. As a result, each current sample, $i_A(n)$, $i_B(n)$, and $i_C(n)$ in the current matrix, $I_{ABC}$, is a sum of the two respective current components, and provided the zero sequence current is appropriately selected, the three samples no longer sum to zero, such that the current matrix is full rank. This allows Equation (3) to be used to determine the coefficient vector, $h_1$, because the inversion of the current matrix is no longer ill-conditioned.

The zero sequence current can be any type of current signal, provided that it is not correlated with the multi-phase current components, Ia, Ib, Ic. In some examples, the zero sequence current includes one or more tones having a frequency different from the frequency of the multi-phase current components, Ia, Ib, Ic. In other examples, the zero sequence current can be a non-periodic, random, or otherwise varying current. In some examples, the zero sequence current components, $I_0$, $I_{00}$, and $I_{000}$ have the same frequency, phase, and amplitude. However, in other examples, the zero sequence current components, $I_0$, $I_{00}$, and $I_{000}$, may have different frequencies, phases, and/or amplitudes. The zero sequence current can be injected onto the busbar conductors 120, 121, 122 in a variety of different ways.

Referring again to FIG. 4, in one example, the inverter 402 can be driven to provide the zero sequence current in addition to the multi-phase currents. In one such example, DC-blocking capacitors 406 and 408 are connected between the neutral common terminal 420 and either side of the voltage supply 404, as shown in FIG. 4. These capacitors 406, 408 provide a return path for current from the neutral point terminal 420 to the voltage supply 404. In other examples, the capacitors 406, 408 may be replaced with other electrical circuit networks for better impedance control between inductive loads and the zero-sequence path at different frequencies. The inverter 402 is driven, via the control signals C0, C1, and C2, to generate the multi-phase current components Ia, Ib, Ic and the zero sequence current components $I_0$, $I_{00}$, $I_{000}$. In one example, the control signals C0, C1, C2 are pulse width modulation (PWM) control signals that provide control of each phase of the multi-phase currents and inject the zero sequence current components. The zero sequence current components, $I_0$, $I_{00}$, $I_{000}$, return to the voltage supply through the capacitors 406, 408 (or other circuitry), which breaks the perfect correlation of the three-phase currents that would otherwise exist.

The control signals, C0, C1 C2, for the inverter 402 may be provided by a controller, which in some examples, may also perform certain calibration calculations. FIG. 5A illustrates an example of a controller 500 with an integrated calibration module that is configured to produce control signals 502 to control the inverter 402, and is also configured to perform calibration processes to produce the vector, [H], of calibration coefficients. Accordingly, the calibration controller 502 includes at least one sensor input to receive sensor measurement signals 504 representing magnetic field measurements taken by one or more sensors under calibration.

In some examples, the controller 500 further includes at least one data input to receive reference measurements 506 of the currents 140, 141, 142 flowing in the conductors 120, 121, 122, respectively. The data input may be an I2C interface, for example. The reference measurements 506 may be acquired by any type of sensor or measurement circuit that can produce an accurate reference measurement of the current. The sensor(s) or measurement circuit(s) used to provide the reference measurements 506 may include coreless or shielded magnetic field sensors, direct current measurement circuits, or other devices. In other examples, the calibration controller 500 may not receive the reference measurements 506 from an external sensor or measurement circuit, but may instead acquire reference values of the currents 140, 141, 142 (e.g., from a computer readable storage medium internal or external to the calibration controller) or may determine the reference values of the currents 140, 141, 142 based on control information used by the calibration controller 500 to generate the control signals 502 that drive the inverter 402 to produce the currents.

FIG. 5B and FIG. 5C illustrate another example of a controller and a calibration module that individually interface with the system of FIG. 4. As shown in FIGS. 5B and 5C, a controller 510 (FIG. 5B) can be used to produce the control signals 502 and a separate calibration module 520 (FIG. 5C) can be used to perform the calibration calculations and processes to produce the coefficient vector [H]. In some examples, the controller 510 may be integrated with the inverter 402. The controller 510 includes at least one control output at which the control signals 502 are provided. The calibration module 520 includes at least one data output at which the calibration coefficients, [H], are provided, and at least one sensor input to receive the sensor measurement signals 504. The calibration module 520 may further include at least one data input or current sensing input to receive the reference measurements 506 of the currents 140, 141, 142. The data input(s) and/or output(s) may be I2C interfaces.

The controller 500 with an integrated calibration module, the controller 510, and/or the calibration module 520 can be implemented using one or more processors and associated circuitry to perform the functions described herein. The calibration controller 500, the controller 510, and/or the calibration module 520 may be implemented using hardware, software, and/or firmware, or any combination thereof, as described further below. The calibration controller 500 and/or the calibration module 520 may include one or more computer readable media encoded with instructions that when executed by one or more processors cause the calibration controller 500 and/or the calibration module 520 to implement various processes and functions associated with the calibration processes and techniques disclosed herein.

Figure 6:
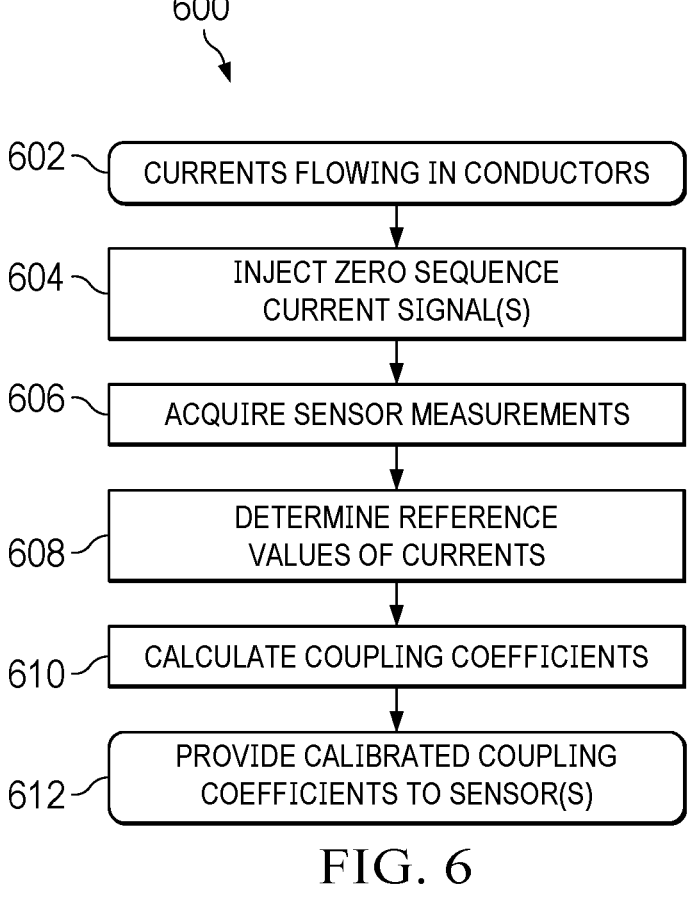
FIG. 6 is a flow diagram illustrating a method for calibration of a current sensor, according to some examples.

FIG. 6 illustrates a method 600 for calibrating a current sensor, such as current sensor package 110. Method 600 can be performed by, for example, the controller 500 with an integrated calibration module, the controller 510, the calibration module 520, and other example controller circuits in this disclosure, in conjunction with a multi-phase power system such as inverter 402. As shown, example method 600 includes a number of phases and sub-processes, the sequence of which may vary from one example to another. However, when considered in aggregate, these phases and sub-processes form a process for calibrating one or more sensors in a current sensor package in certain of the examples described herein, such as illustrated in FIGS. 1-3 and described above. However, other system architectures can be used in other examples. Accordingly, the correlation of the various functions shown in FIG. 6 to the specific components illustrated in the drawings does not imply any structural and/or use limitations. Instead, other examples may include varying degrees of integration, in which multiple functions are effectively performed by one or more systems.

Referring to FIG. 6, in one example, at operation 602, two or more busbar conductors are driven with multi-phase currents simultaneously by, for example, inverter 402.

At operation 604, a zero sequence current is injected onto the busbar conductors, such that the current flowing in each conductor includes the sum of a respective one of the current phases corresponding to the multi-phase currents (e.g., Ia, Ib, or Ic in the examples of FIGS. 1-4) and a zero sequence current component (e.g., $I_0$, $I_{00}$, or $I_{000}$ in the examples of FIGS. 1-4). As described above, in one example, the zero sequence current can be generated by the inverter 402 associated with the sensor package(s) 110, 111, 112 being calibrated through the use of PWM control signals 502 supplied to the inverter 402 from the calibration controller 500 or controller 510. In another example, a secondary inverter (or other multi-phase device) can be controller to produce the zero sequence current, as described further below.

At operation 606, sensor measurements ([B]) are acquired from one or more sensors under calibration. As described above, the sensor measurements may be magnetic field measurements that are based on and representative of the currents flowing the busbar conductors. In some examples, the sensor measurements are acquired by the calibration controller 500 or calibration module 520 from the sensor(s) under calibration. In some examples, a block of N sample sensor measurements are obtained at operation 606, with N being any integer number greater than or equal to 1.

At operation 608, reference values of the currents flowing in the two or more busbar conductors are acquired. As described above, in certain examples, a reference current sensor or measurement circuit can be used to acquire reference measurements of the currents. These reference measurements can then be provided to the calibration controller

500 or calibration module 520. In some examples, a block of N sample reference measurements of the currents are obtained. In other examples, calibration controller 500 or calibration module 520 may have a priori knowledge of the reference values of the currents. For example, there may be sufficient confidence in the accuracy with which the calibration controller 500 or controller 510 can control the inverter 402 (or other device) to produce the currents 140, 141, and/or 142 that an additional reference measurement is not needed. Thus, based on measurements or other information, the calibration controller 500 or calibration module 520 acquires or determines reference values of the currents that can be used to solve an instantiation of Equation (3) for each sensor to calculate the coupling coefficients [H].

At operation 610, the coupling coefficients for the one or more sensors are determined based on the reference values of the currents (acquired at operation 608) and the sensor measurements (acquired at operation 606). As described above, the coupling coefficients can be obtained for each individual sensor in each current sensor package 110, 111, 112 by solving Equation (3) for the corresponding coupling coefficient vector (e.g., $h_1$) using an N-point FFT. In other examples, at operation 606, measurements for multiple sensors under calibration can be obtained, and at operation 610, a corresponding version of Equation (3) can be solved to obtain the coupling coefficients for the multiple sensors, as described above. Thus, it will be appreciated, given the benefit of this disclosure, that operations 606 and 610 (and optionally 608) can be repeated as necessary for one or more sensors under calibration, or can be performed for multiple sensors in combination.

At operation 612, the coupling coefficients are provided to the sensor(s) under calibration. In some examples, the calibration controller 500 or calibration module 520 transfers the coupling coefficients to a computer readable storage medium (e.g., storage device(s) 1309 described below with reference to FIG. 13), from where the coupling coefficients can be read by or programmed into the sensor packages 110, 111, 112 to, for example, generate weights 305, 315, 375, and 385. In other examples, the coupling coefficients can be transferred directly to the sensor processing circuit(s) 230 and/or 270. Additional computation can be done on the coupling coefficients to generate weighting factor configurations in 340 shown in FIG. 3, for example, as described above.

Figure 7:
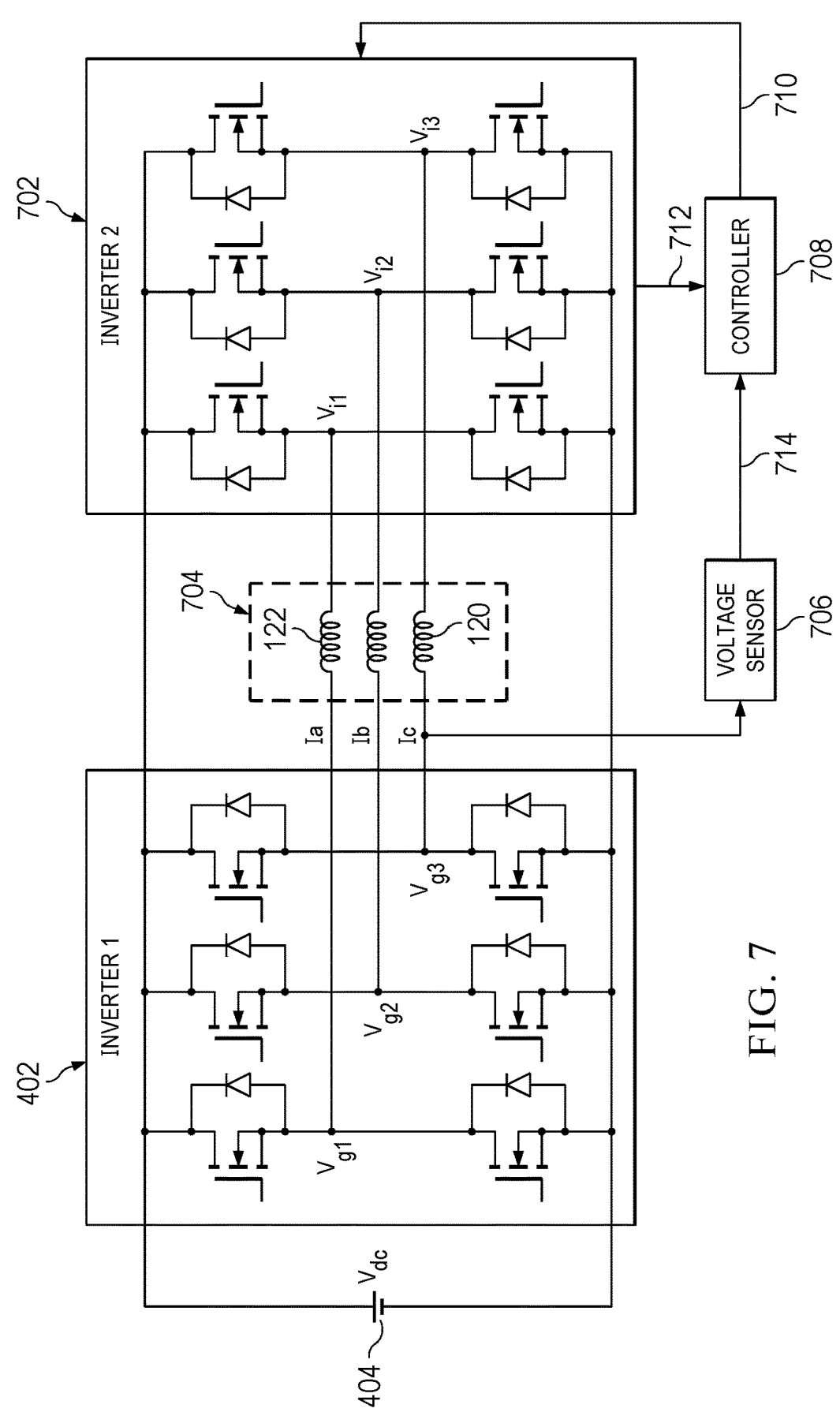
FIG. 7 is a schematic diagram of an inverter system to support calibration of a current sensor, according to some examples.

As described above, in some examples, the zero sequence current (e.g., components $I_0$, $I_{00}$, and $I_{000}$) can be generated by a secondary inverter coupled to the inverter with which the current sensor package(s) 110, 111, 112 are being calibrated. FIG. 7 illustrates an example of a calibration apparatus that includes a secondary inverter 702 configured to inject the zero sequence current.

Referring to FIG. 7, in the illustrated example, the secondary inverter 702 is coupled to the busbar conductors 120, 121, 122 of the inverter 402 under calibration. A sensor module 704 for the inverter 402 under calibration is positioned proximate the busbar conductors 120, 121, 122. The sensor module 704 may include the sensor packages 110, 111, 112 described above, which may be individually packaged integrated circuits or may be combined onto a common printed circuit board or other module platform. The inverter 402 produces the three-phase current components Ia, Ib, Ic, as described above. The inverter 402 may be operated in open loop, meaning that it is controlled (e.g., via the control signals C0, C1, C2 described above) to produce the three-phase currents Ia, Ib, Ic, without feedback since, for the purposes of calibration, precision control of three-phase currents is not required by the inverter 402.

A voltage sensor 706 is coupled to the busbar conductors 120, 121, 122 and configured to provide voltage measurements used during the calibration operation, as described further below.

A controller 708 is coupled to the secondary inverter 702 and configured to provide control signals 710 to the secondary inverter 702 to control the secondary inverter 702 to generate the zero sequence current, as described further below. In some examples, the secondary inverter is operated in closed loop to achieve precision control of the zero sequence current. Accordingly, the controller 708 may include at least one current sensing input that receives current measurement signals 712 from the secondary inverter 702, and at least one voltage sensing input that receives voltage signals 714 from the voltage sensor 706. The controller 708 may be part of or may include the calibration controller 500 or the controller 510 described above with reference to FIGS. 5A and 5B. The calibration apparatus arrangement shown in FIG. 7 can be configured to allow for multi-phase and single-phase current calibration, while minimizing requirements for the voltage supply 404 and operating current.

The secondary inverter 702 provides a path for the zero sequence current, thus decoupling and breaking the perfect correlation between the multi-phase currents in the busbar conductors 120, 121, 122, thereby allowing for multi-phase calibration, as described above. Advantageously, the secondary inverter 702 and the controller 708 can be configured to control the calibration currents while the inverter 402 under calibration operates, and the control of inverter 402 can be independent from (or unaffected by) the injection of the zero sequence currents. For example, inverter 402 can provide the multi-phase currents in an open loop operation and not regulated/controlled by controller 708. Thus, there is no need to update or otherwise modify the firmware of the inverter 402 to inject the zero sequence current. Further, the calibration process can be implemented and controlled through the secondary inverter 702 and the controller 708, thus avoiding any need to reconfigure the hardware of the inverter 402. In some examples, secondary inverter 702, voltage sensor 706, and controller 708 can be part of a calibration kit that can be directly plugged into sensor module 704 and inverter 402 to inject the zero sequence currents, while inverter 402 drives the multi-phase currents Ia, Ib, Ic independently from the operations of secondary inverter 702, voltage sensor 706, and controller 708. Sensor module 704 can generate magnetic field measurements and compute the coupling coefficients as described above. Accordingly, the calibration can be performed quickly and easily with low risk of systematic error.

Figure 8A:
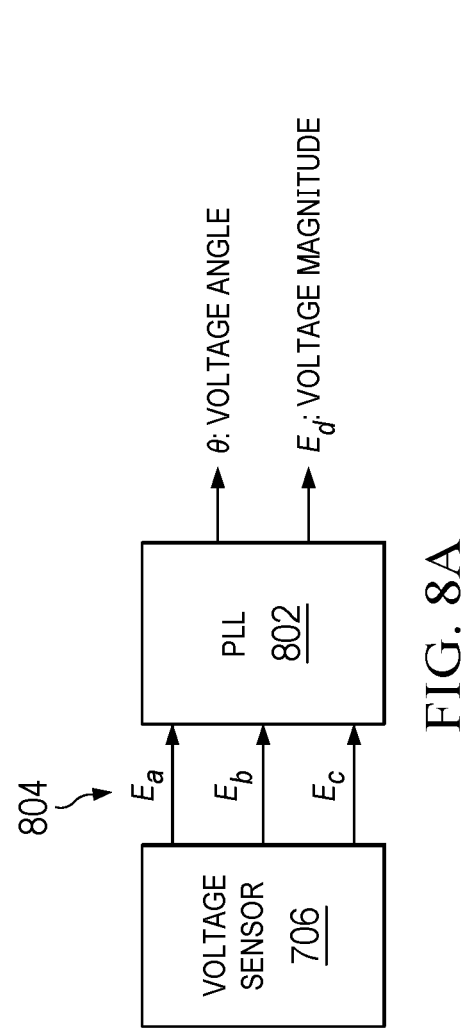
FIGS. 8A and 8B are schematic diagrams illustrating components of a calibration controller of FIG. 7, according to some examples.
Figure 8B:
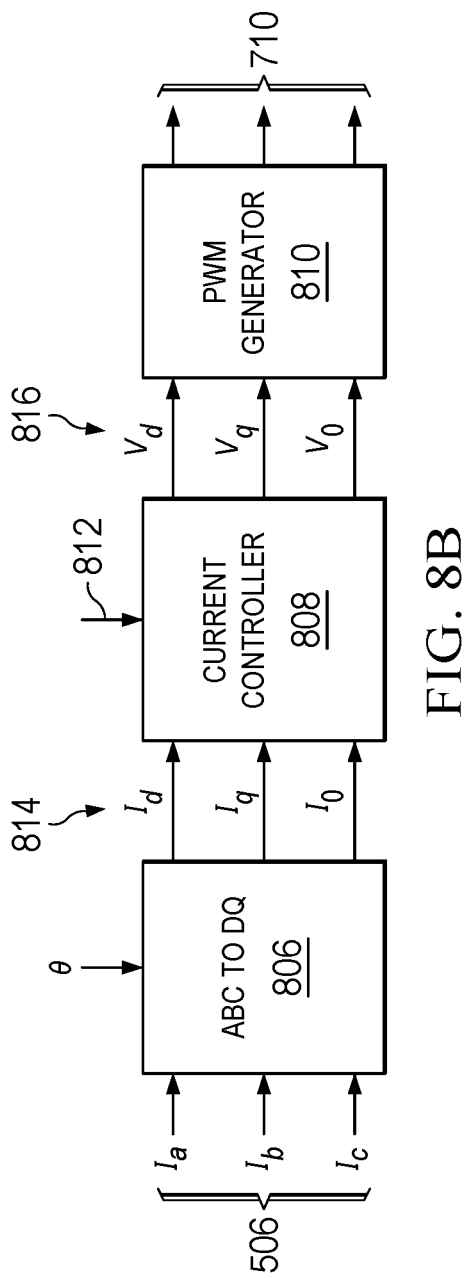

According to certain examples, to implement the calibration operation, the controller 708 is configured to implement a field oriented control strategy by treating the inverter 402 as grid running in open loop. FIGS. 8A and 8B are schematics illustrating internal components of controller 708 according to some examples. Referring to FIGS. 8A and 8B, the controller 708 may be implemented using a phase-locked loop (PLL) 802 in combination with a current controller 808 and a PWM signal generator 810. A variable converter 806 converts phase a, b, and c variables, such as measured voltages and currents as described below, to a rotating d-q-0 reference frame to implement field oriented control.

Figure 9:
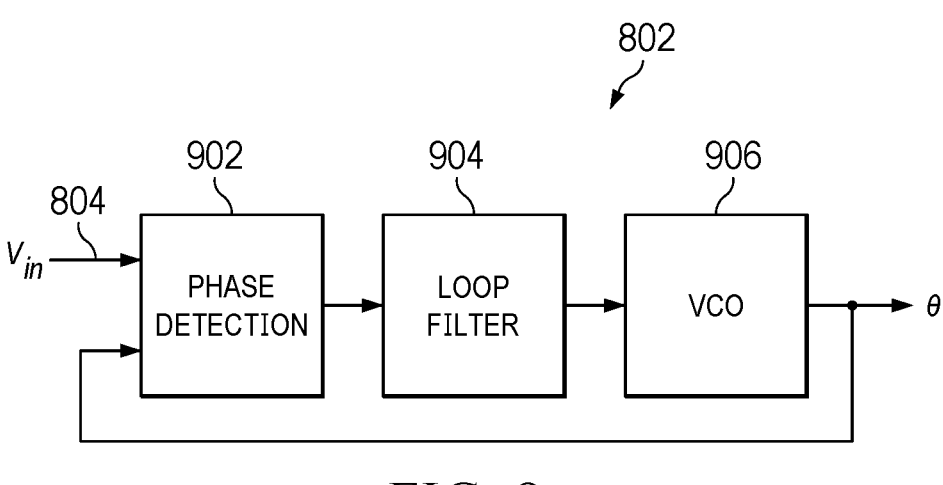
FIGS. 9 and 10 are schematic diagrams illustrating a configuration of the phase-locked loop of FIG. 8A, according to some examples.
Figure 10:
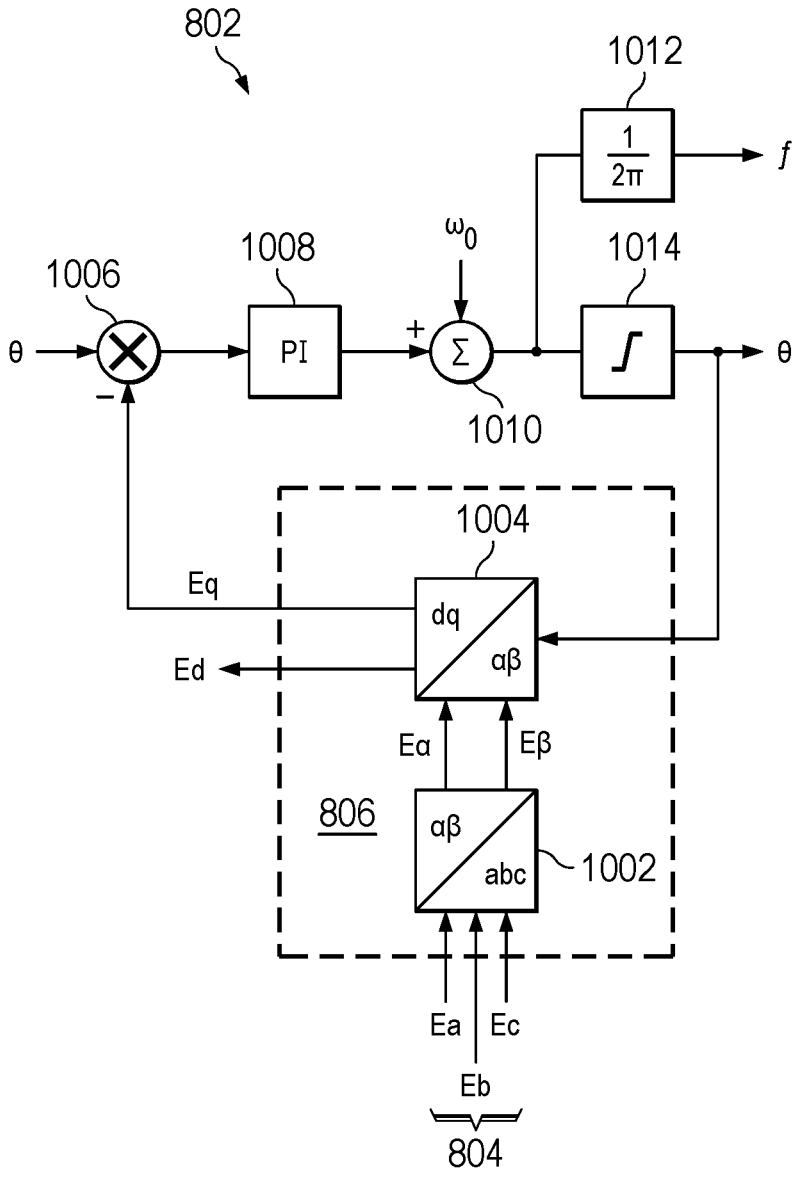

The PLL 802 can be implemented using any of a variety of PLL architectures, an example of which is illustrated in FIG. 9. As shown, the PLL 802, in this example, the PLL 802 includes a phase detector 902, a loop filter 904, and a voltage controlled oscillator 906. The loop filter 904 can be configured with a wide bandwidth to accommodate a large range of frequencies during the calibration operation. The PLL 802 receives as inputs, voltage measurements 804 of the inverter 402 voltages from the voltage sensor 706. In some examples, the PLL 802 is configured as a synchronous frame grid PLL, an example of which is illustrated in FIG. 10, which allows for estimating the magnitude ($E_d$) and phase (θ) of the voltages of the inverter 402, as described further below. The PLL 802 is used to synchronize the secondary inverter 702 to the inverter 402 under calibration without modifying the firmware of the inverter 402.

The PWM signal generator 810 is used to generate PWM control signals 710 to control the secondary inverter 702 to inject the zero sequence current components $I_0$, $I_{00}$, and $I_{000}$. For simplicity of explanation, the zero sequence current components are referred to below in combination as $I_0$; however, as described above, in various examples, the zero sequence current components flowing in respective busbar conductors need not be identical and can have different magnitudes, phases, and/or frequencies, provided only that they are not correlated with the multi-phase currents. By controlling the PWM control signals 710, the parameters of the zero sequence current (e.g., frequency, phase, amplitude, etc.) can be controlled. The parameters of the zero sequence current are tunable and can be made continuously variable by dynamically adjusting the PWM control signals 710.

The current controller 808 controls the PWM signal generator 810 based on input current values 506 and data 812 representing desired parameters or characteristics (e.g., phase amplitude, and frequency) of the zero sequence current, Jo. The current controller 808 may be implemented using one or more proportional-integral (PI) controllers and feed forward terms.

In one example, the controller 708 having the architecture illustrated in FIGS. 8A and 8B is configured according to a control model as set forth in Equations (4)-(6):

$$V_d = RI_d + L\frac{dI_d}{dt} - \omega LI_q + E_d \tag{4}$$

$$0 = RI_q + L\frac{dI_q}{dt} + \omega LI_d \tag{5}$$

$$V_0 = RI_0 + L\frac{dI_0}{dt} + E_0 \tag{6}$$

In Equations (4)-(6), $V_d$ and $V_0$ are the secondary inverter 702 voltages, $E_d$ and $E_0$ are the voltages of the inverter 402 under calibration, and $I_d$, $I_q$, and $I_0$ are the currents flowing out of the secondary inverter 702. The q-axis voltages, $V_q$ and $E_q$, are zero because the PLL 802 is configured to align the secondary inverter 702 with the inverter 402 under calibration so as eliminate circulating currents. Also in Equations (4)-(6), R and L are the resistance and inductance values of the busbar conductors 120, 121, 122, and co is the frequency of the multi-phase currents.

Referring again to FIG. 8A, the voltage sensor 706 is used to measure the voltages of the inverter 402, and provides these voltage measurements, Ea, Eb, Ec (collectively 804), as inputs to the PLL 802. Based on the voltage measurements 804, the PLL 802 determines a voltage angle, θ, along with the voltage magnitude, $E_d$, used in Equation (4).

FIG. 10 illustrates internal components of PLL 802, according to some examples. Referring to FIG. 10, as described above, in certain examples, the PLL 802 can be implemented as a synchronous frame grid PLL. In this example, the variable converter 806 is used to transform the input voltage measurements 804 from the a-b-c reference frame to the d-q-0 reference frame. In some examples, the variable converter 806 may be the same variable converter used to transform the current measurements 504 into the d-q-0 reference frame, as shown in FIG. 8B. In other examples, the PLL 802 may include a dedicated variable converter 806 and an additional variable converter 806 may be used for the current signals. The variable converter 806 includes a first transformation block 1002 that performs a Blake transformation to convert the input voltages Ea, Eb, Ec from the stationary a-b-c reference frame to an intermediary α-β-0 reference frame according to:

$$\begin{bmatrix} E_\alpha \\ E_\beta \\ E_0 \end{bmatrix} = \frac{2}{3} \begin{bmatrix} 1 & -\frac{1}{2} & -\frac{1}{2} \\ 0 & \frac{\sqrt{3}}{2} & -\frac{\sqrt{3}}{2} \\ \frac{1}{2} & \frac{1}{2} & \frac{1}{2} \end{bmatrix} \begin{bmatrix} E_a \\ E_b \\ E_c \end{bmatrix} \tag{7}$$

A second transformation block 1004 converts the $E_\alpha$ and $E_0$ terms into the rotating d-q reference frame by applying a peak transformation using the voltage angle, θ, determined by the PLL 802:

$$\begin{bmatrix} E_d \\ E_q \end{bmatrix} = \begin{bmatrix} \cos\theta & \sin\theta \\ -\sin\theta & \cos\theta \end{bmatrix} \begin{bmatrix} E_\alpha \\ E_\beta \end{bmatrix} \tag{8}$$

The q-axis voltage, $E_q$, is fed back into the PLL loop, along with the voltage angle, θ, via a combiner 1006. A PI controller 1008 is configured to align the secondary inverter 702 with the inverter 402 under calibration so as to drive the q-axis voltage, $E_q$, to zero, as described above.

A summation block 1010 receives as an input the frequency, $\omega_0$, of the multi-phase currents, which can be converted by block 1012 from radians into Hertz, to produce a frequency estimate, f, of the multi-phase currents. An integrator 1014 produces the voltage angle, θ, based on the transformed voltage measurements 804 and the input frequency, $\omega_0$.

Referring again to FIG. 8B, the variable converter 806 operates on the input reference multi-phase current values 506 to transform the reference current values, using the voltage angle, θ, from the PLL 802, into the rotating d-q-0 reference frame in the same manner as the voltage transformation described above with reference to FIG. 10. Based on the transformed reference values 814 and the data 812 specifying the desired parameters of the zero sequence current, Jo, the current controller 808 generates control voltages 816 that are input to the PWM signal generator 810. In some examples, since the secondary inverter 702 is a voltage source inverter, it controls the currents through the inverter voltage. Accordingly, the PWM generator 810 determines switching signals $q_a$, $q_b$, and $q_c$ that drive the secondary inverter 702 to achieve the voltage commands set by the current controller 808. In one example, a technique used is sine-triangle pulse width modulation. For each phase of the multi-phase currents, a respective triangular wave (Via, Vib, Vic) operating at a switching frequency $f_{sw}$ is generated by the controller 708 and compared to the corresponding control voltages 816 to produce the switching signals.

Figure 11:
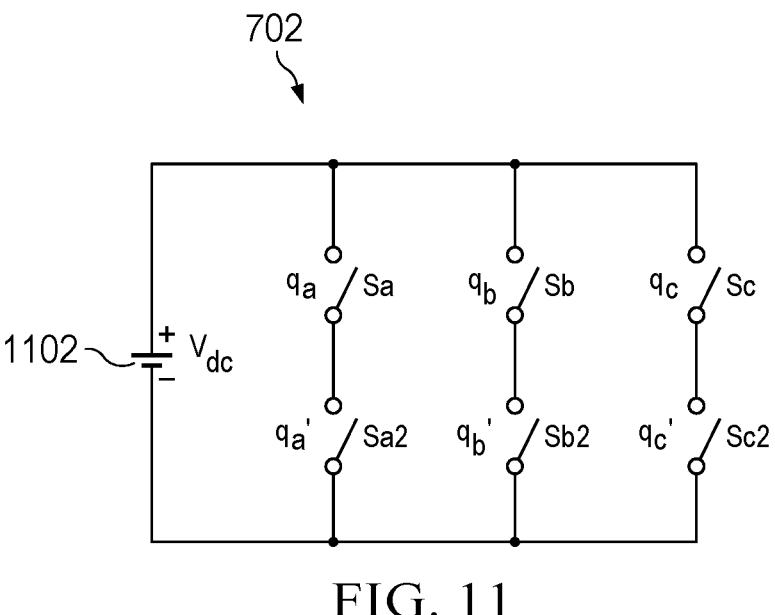
FIG. 11 is a schematic diagram illustrating pulse width modulation (PWM) switching control of an inverter for current generation, according to some examples.

FIG. 11 is a diagram illustrating internal components of the secondary inverter 702, according to some examples. In the example of FIG. 11, the secondary inverter 702 is a three-phase inverter and includes three pairs of switches (which may be implemented using power transistors) Sa and Sa2, Sb and Sb2, and Sc and Sc2 (collectively S). The switches are coupled to a DC voltage supply 1102. The controller 708 generates PWM switching signals, $q_a$, $q_b$, and $q_c$, and their complements ($q_a'$, $q_b'$, and $q_c'$) that are used to drive the gates of the transistor switches, S. In one example, the switching signals $q_a$, $q_b$, and $q_c$, are binary digital signals with a value of either 0 (low) or 1 (high). In one example, if the control voltage 816 for any phase of the multi-phase currents is greater than the corresponding triangle wave voltage, the corresponding switching signal (e.g., $q_a$) is set to 0 and its complement (e.g., $q_a'$) is set to 1. In contrast, if the control voltage 816 for a phase is less than or equal to the corresponding control voltage, the switching signal q is set to 1 and its complement, q', is set to 0. In this manner, the secondary inverter 702 is controlled to generate currents that correspond to the control voltages, which are controlled by the controller 708 to produce currents having desired characteristics.

Thus, the secondary inverter 702 can be controlled by the controller 708, using voltage measurements acquired from the voltage sensor 706, to control the multi-phase currents flowing in the busbar conductors 120, 121, 122 and to inject the zero sequence current generated by the secondary inverter 702. This allows multi-phase calibration of the sensor module 704, as described above. Advantageously, because current control is implemented through the secondary inverter 702 and the controller 708, the inverter 402 can operate in open loop, as described above, and therefore can be calibrated without requiring any modifications to the hardware or firmware of the inverter 402. The techniques disclosed herein can be used to calibrate any type of multi-phase power system, including, but not limited to, three-phase inverters such as traction inverters, over a wide range of voltage and current rating specifications.

According to certain examples, various operations of the calibration operation can be performed or directed by a calibration/control module that includes one or more processors configured to execute instructions stored on one or more non-transitory computer-readable media. The calibration/control module can be coupled to external hardware devices, such as the voltage sensor 706 and secondary inverter 702 described above, for example, as needed to acquire measurements used in the calibration operation and/or to cause signals used in the calibration operation to be produced.

In some examples, a sensor package of the sensor module 704 can receive reference measurements of calibration currents in other busbars, each including both the multiphase current component and the zero sequence components, and combine those with the magnetic field/current measurement provided by the sensor package to determine the coupling coefficients.

Figure 12:
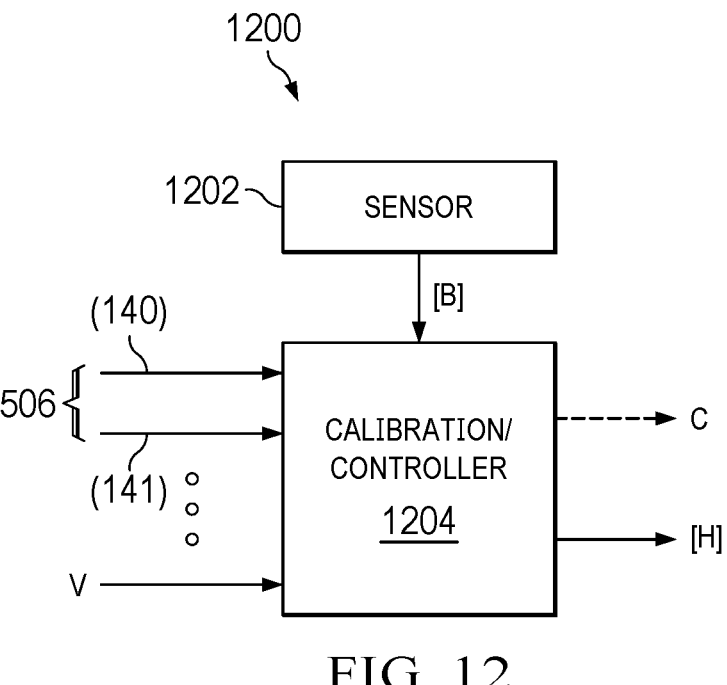
FIG. 12 is a schematic diagram illustrating an integrated circuit including a current sensor and a calibration controller, according to some examples.

FIG. 12 illustrates an example of an integrated circuit 1200 that can include a sensor 1202 and a sensor controller 1204, which includes an integrated calibration module. In some examples, integrated circuit 1200 can be part of or can include sensor package 110. Referring to FIG. 12, Sensor 1202 may include one or more sensors for which coupling coefficients are to be determined during a calibration procedure, as described above. The sensor controller 1204 may include at least some of the functionality and components described above with reference to the calibration controller 500, controller 510, and/or calibration module 520. Accordingly, in the illustrated example, the sensor controller 1204 includes at least one sensor input to receive the sensor measurement signals [B] from the sensor 1202. Sensor measurement signals [B] can include measurements of a magnetic field generated by a first calibration current on a first conductor that proximate integrated circuit 1200, as well as an interference magnetic field generated by a second calibration current on a second conductor. Each of first and second calibration currents can be an AC current and include a zero sequence component, as explained above.

The sensor controller 1204 also has one or more data inputs to receive the reference current values 504 for the first and second calibration currents. The sensor controller 1204 determines the coupling coefficients, [H], for the one or more sensors included in the sensor 1202 based on, for example, Equation 3. The coupling coefficients, [H], can be stored in a computer-readable medium or encoded into the firmware of the sensor package(s) in the sensor module 1202, for example. In some examples, the sensor controller 1204 can include a processing circuit, such as sensor processing circuit 230, that can determine the weights based on coupling coefficients, which can be used by sensor controller 1204 to remove/reduce the magnetic interference component from subsequent sensor measurement signals [B] provided by sensor 1202. For example, as described above, in the example of the sensor package 110 of FIG. 3, the calibrated coupling coefficients can be used by the weight generators 340, 360 to produce the weighting factors used to balance the magnetic field measurements taken by the sensors and mitigate effects of the interference 130 between nearby busbar conductors 120, 121, 122. Sensor controller 1204 can also provide a measurement signal 1208 representing a measurement of a current (e.g., measurement signal 395) on a conductor with the interference components removed/reduced.

Figure 13:
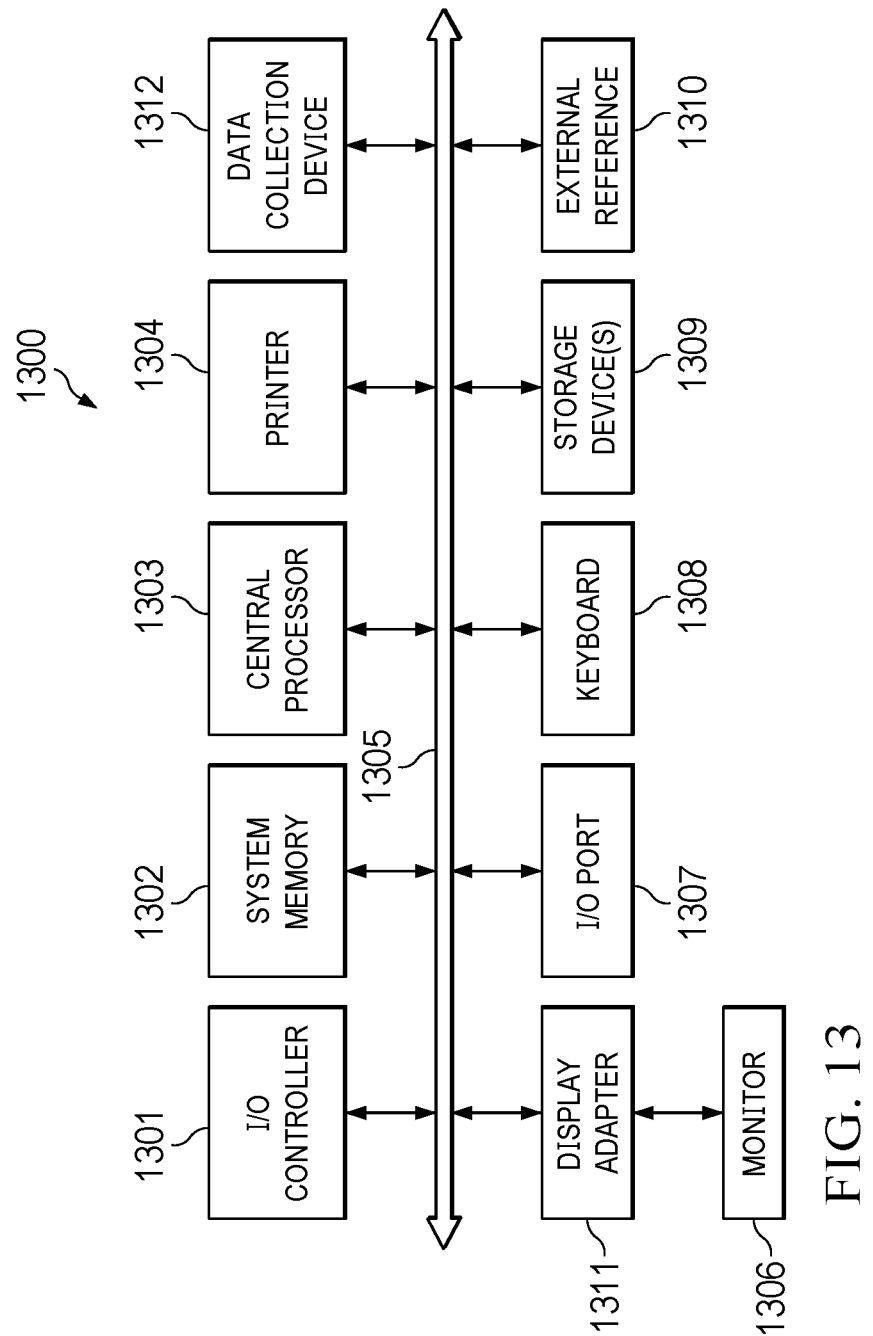
FIG. 13 is a schematic diagram illustrating a hardware computing system that can implement techniques of some examples, in an example.

FIG. 13 illustrates an example hardware computing system 1300 that can be used to implement, in whole or in part, any of the control/calibration devices and functionality described herein, including aspects of the calibration controller 500, controller 510, calibration module 520, and/or controller 708. The hardware computing system 1300 includes a number of example subsystems. The subsystems shown in FIG. 13 are interconnected via a system bus 1305. Additional subsystems such as a printer 1304, keyboard 1308, storage device(s) 1309, monitor 1306 (which is coupled to display adapter 1311) and others are shown. Peripherals and input/output (I/O) devices, which couple to I/O controller 1301, can be connected to the hardware computing system by any number of means such as input/output (I/O) port 1307 (e.g., USB, FireWire®). For example, I/O port 1307 or external interface 1310 (e.g. Ethernet, Wi-Fi, etc.) can be used to connect hardware computing system 1300 to a wide area network such as the Internet, a mouse input device, or a scanner. The interconnection via system bus 1305 allows the central processor 1303 to communicate with each subsystem and to control the execution of a plurality of instructions from system memory 1302 or the storage device(s) 1309 (e.g., a fixed disk, such as a hard drive, or optical disk), and the exchange of information between subsystems. The system memory 1302 and/or the storage device(s) 1309 may embody a computer-readable medium. In some examples, central processor 1303 can execute instructions stored in system memory 1302 and/or storage device(s) 1309 to perform the example computations and methods described above with reference to, for example, FIG. 6. The central processor 1030 can use system memory 1302 to store the input data, output data, as well as intermediary data generated from the performance of the method. Another subsystem is a data collection device 1312, such as the battery impedance sense circuit 302, ADC 304, and ADC 314 of FIG. 3. Any of the data described herein can be output from one component to another component and can be provided to the user.

A hardware computing system can include the same components or subsystems, e.g., connected together by external interface 1310 or by an internal interface. In some examples, hardware computing systems, subsystem, or apparatus can communicate over a network. In such instances, one computer can be a client and another computer a server, where each can be part of a same computer system. A client and a server can each include multiple systems, subsystems, or components.

Figure 14:
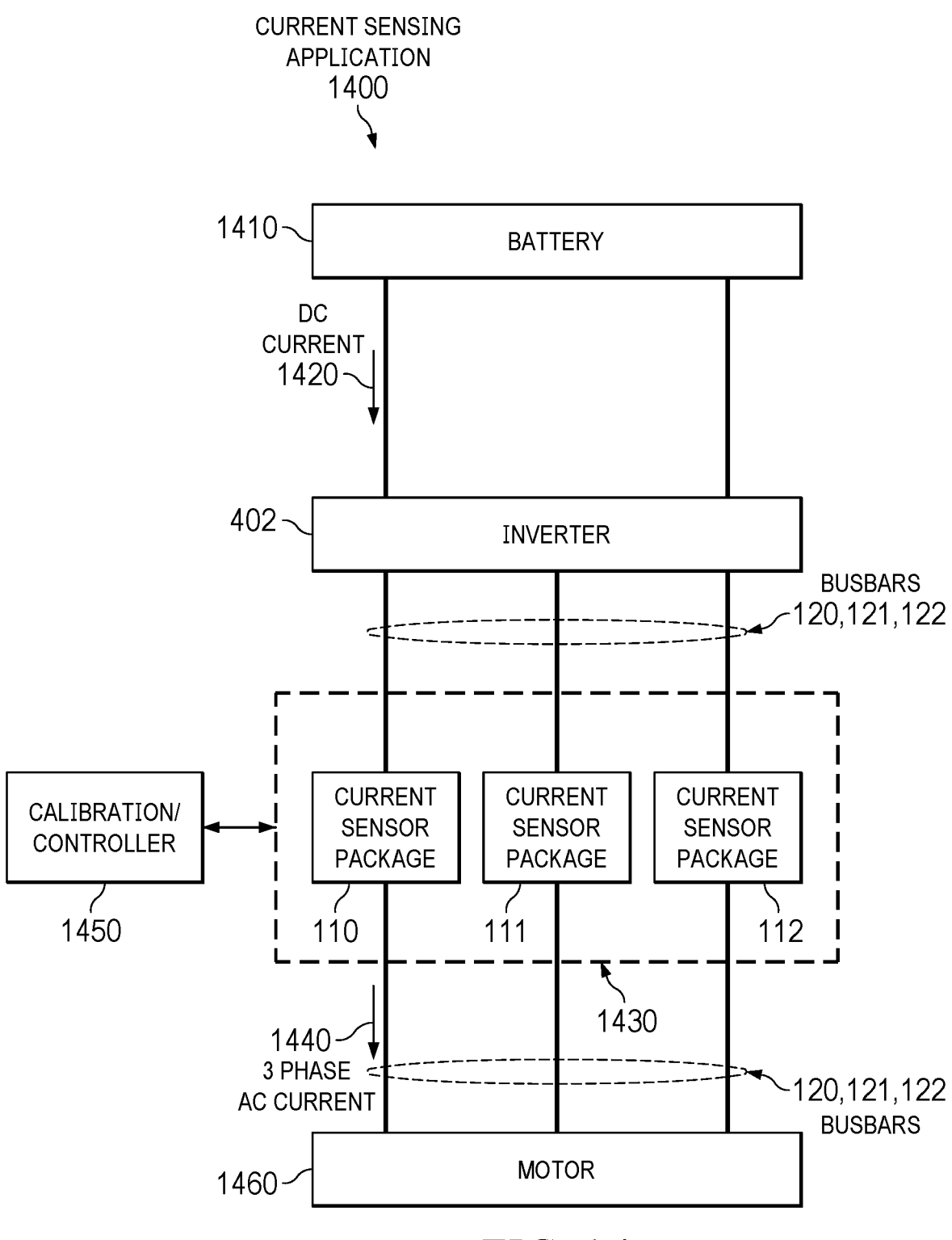
FIG. 14 is a schematic diagram illustrating an example system including of current sensor packages and a calibration controller, according to some examples.

FIG. 14 illustrates one example system 1400 of the current sensor packages 110, 111, and 112 of FIG. 2 and associated calibration techniques disclosed herein. The illustrated example is a traction inverter as might be used, for example, to drive a motor in an electric vehicle. The traction inverter 402 is configured to convert DC current 1420, provided by battery 1410, to three phase AC current 1440 to be delivered to motor 1460 on busbars 120, 121, and 122. In an application such as this, it can be important to monitor the amplitude of the current on each phase, for example to make any necessary adjustments for efficient operation of the motor. Current sensor packages 110, 111, and 112 are deployed on bus bars 120, 121, and 122, as described above, to provide current monitoring of the associated busbar with improved accuracy compared to existing techniques by reducing interference from other busbars. The current sensor packages 110, 111, 112 collectively form a sensor module 1430, which may correspond to the sensor module 1202 described above, for example. During calibration, a calibration/controller module 1450 is coupled to the sensor module 1430 and configured to implement any of the calibration techniques described herein and to produce the coupling coefficients, [H], for the sensor module 1430. In some examples, the current measurements generated by the current sensor packages may be provided to a controller (not shown) that is configured to control the inverter, the motor, or other systems of the application (e.g., the electric vehicle).

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. For example, a resistor, capacitor, or transistor shown and described herein as a single component may instead be multiple resistors, capacitors, or transistors, respectively, coupled in series or parallel between the same nodes.

While certain elements of the described examples are included in an integrated circuit and other elements are external to the integrated circuit, in other example examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Any uses of the phrase "ground" or "ground node" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

FURTHER EXAMPLES

Example 1 is a method comprising receiving, from a sensor proximate a first conductor, a sensor signal representing a measurement of a magnetic field produced based on a first current flowing in the first conductor and a second current flowing in a second conductor, the first current including a first current component having a particular frequency and a second current component having a different frequency from the first current component, and the second current including a third current component having the particular frequency and phase shifted from the first current component and a fourth current component having a different frequency from the third current component, determining a reference value of the first current, determining a reference value of the second current, and based on the sensor signal and the reference values of the first and second currents, determining for the sensor, a plurality of coupling coefficients representing magnetic field coupling between the first and second conductors.

Example 2 includes the method of Example 1, wherein the second and fourth current components have a same frequency, a same amplitude, and a same phase.

Example 3 includes the method of one of Examples 1 and 2, wherein the second and fourth current components are non-periodic.

Example 4 includes the method of any one of Examples 1-3, wherein the second and fourth current components include random components.

Example 5 includes the method of any one of Examples 1-4, wherein the sensor is a first sensor, the sensor signal is a first sensor signal, the magnetic field is a first magnetic field, and the plurality of coupling coefficients is a first plurality of coupling coefficients. The method further comprises receiving, from a second sensor proximate the second conductor, a second sensor signal representing a measurement of a second magnetic field produced based on the first and second currents, and based on the second sensor signal and the reference values of the first and second currents, determining for the second sensor, a second plurality of coupling coefficients representing magnetic field coupling between the first and second conductors.

Example 6 includes the method of any one of Examples 1-4, wherein the sensor is a first sensor, the sensor signal is a first sensor signal, the measurement of the magnetic field is a first measurement, and the plurality of coupling coefficients is a first plurality of coupling coefficients. The method further comprises receiving, from a second sensor proximate the first conductor, a second sensor signal representing a second measurement of the magnetic field, and based on the second sensor signal and the reference values of the first and second currents, determining for the second sensor, a second plurality of coupling coefficients representing magnetic field coupling between the first and second conductors.

Example 7 includes the method of any one of Examples 1-4, wherein determining the reference value of the first current comprises receiving, from a first reference sensor, a first reference sensor signal representing a measurement of the first current, and wherein determining the reference value of the second current comprises receiving, from a second reference sensor, a second reference sensor signal representing a measurement of the second current.

Example 8 includes the method of any one of Examples 1-7, further comprising simultaneously providing the first and second current signals through the first and second conductors, respectively.

Example 9 includes the method of Example 8, wherein providing the first current signal through the first conductor includes providing a first pulse width modulation (PWM) signal to an inverter, and wherein providing the second current signal through the second conductor includes providing a second PWM signal to the inverter.

Example 10 includes the method of Example 8, wherein providing the first current signal through the first conductor includes providing a first pulse width modulation (PWM) signal to a first inverter to generate the second current component, transmitting the second current component to a second inverter, and providing a drive signal to the second inverter to generate the first current component, and to generate the first current signal by summing the first and second current components. Providing the second current signal through the second conductor includes providing a second PWM signal to the first inverter to generate the fourth current component, transmitting the fourth current component to the second inverter, and providing a second drive signal to the second inverter to generate the third current component, and to generate the second current signal by summing the third and fourth current components.

Example 11 includes the method of Example 10, further comprising receiving, from the second inverter, a first voltage signal and a second voltage signal, determining a voltage angle based on the first and the second voltage signals, generating the first PWM signal based on the voltage angle, and generating the second PWM signal based on the voltage angle.

Example 12 includes the method of Example 11, further comprising receiving a first reference signal representing a target value of the second current component, and receiving a second reference signal representing a target of the fourth current component, wherein generating the first PWM signal includes generating the first PWM signal based on the first reference signal, and wherein generating the second PWM signal includes generating the second PWM signal based on the second reference signal.

Example 13 includes the method of Example 11, further comprising receiving a first reference sensor signal representing a measurement of the first current from a first reference sensor proximate the first conductor, receiving a second reference sensor signal representing a measurement of the second current from a second reference sensor proximate the second conductor, generating the first PWM signal based on the first reference sensor signal, and generating the second PWM signal based on the second reference sensor signal.

Example 14 includes a computer readable medium encoded with instructions that, when executed by one or more processors, cause the method of any one of Examples 1-13 to be carried out.

Example 15 is an apparatus comprising an inverter having a current terminal and at least one control terminal, a sensor module including at least one sensor and configured to provide a sensor signal representative of a measurement of a magnetic field produced based on multi-phase current signals present at the current terminal, and a controller having a voltage sensing input, a current sensing input coupled to the sensor module, and a control output coupled to the at least one control terminal. The controller is configured to determine a voltage angle based on voltage measurements received at the voltage sensing input, receive, at the current sensing input, the sensor signal, and provide, based on the voltage angle and a reference measurement of the multi-phase current signals, a pulse width modulation (PWM) control signal at the control output to control the inverter to produce a calibration current signal at the current terminal, the calibration current signal having a first frequency, wherein the multi-phase current signals include a combination of multi-phase drive currents and the calibration current, the multi-phase drive currents having a second frequency different from the first frequency.

Example 16 includes the apparatus of Example 15, wherein the controller further includes a data input configured to receive the reference measurement.

Example 17 includes the apparatus of Example 16, wherein the data input includes an 12C interface.

Example 18 includes the apparatus of any one of Examples 15-17, wherein the controller is further configured to determine, based on the sensor signal and the reference measurement, a plurality of coupling coefficients for the at least one sensor.

Example 19 includes the apparatus of Example 18, wherein the sensor module includes a data input, wherein the controller includes a data output coupled to the data input of the sensor module, and wherein the controller is configured to provide the plurality of coupling coefficients to the sensor module via the data output.

Example 20 includes the apparatus of Example 19, wherein the data output of the controller and the data input of the sensor module are configured as 12C interfaces.

Example 21 includes the apparatus of any one of Examples 15-20, wherein the inverter is a first inverter, and further comprising a second inverter having a current terminal coupled to the current terminal of the first inverter, the second inverter being configured to produce the multi-phase drive currents.

Example 22 includes the apparatus of any one of Examples 15-21, wherein the controller comprises at least one reference current sensor configured to provide the reference measurement of the multi-phase current signals.

Example 23 is an apparatus comprising a sensor having a sensor output and configured to provide a sensor signal at the sensor output, and a calibration controller having a sensor input coupled to the sensor output, a data input, and a control output. The calibration controller is configured to receive the sensor signal via the sensor input, receive, at the data input, data representing a measurement of the first calibration current and a measurement of the second calibration current, determine, based on the sensor signal and the measurements of the first and second calibration currents, a plurality of coupling coefficients for the sensor, and provide, at the control output, data representing the plurality of coupling coefficients.

Example 24 includes the apparatus of Example 23, wherein the sensor signal is representative of a magnetic field produced by the first and second calibration currents.

Example 25 includes the apparatus of one of Examples 23 and 24, wherein the control output is an I2C interface.

Example 26 includes the apparatus of any one of Examples 23-25, wherein the first calibration current includes a first current component having a particular frequency and a second current component having a different frequency from the first current component, and the second calibration current includes a third current component having the particular frequency and phase shifted from the first current component and a fourth current component having a different frequency from the third current component.

Example 27 includes the apparatus of Example 26, wherein the second and fourth current components have a same frequency, a same amplitude, and a same phase.

Example 28 includes the apparatus of one of Examples 26 and 27, wherein the control output is a first control output, wherein the calibration controller further has a second control output, and wherein the calibration controller is configured to provide, at the second control output, a control signal specifying at least one parameter of the second and fourth current components.

Example 29 include the apparatus of any one of Examples 23-28, wherein the control output is a first control output, wherein the calibration controller further has a second control output, and wherein the calibration controller is configured to provide, at the second control output, a pulse width modulation (PWM) control signal to generate a zero sequence component of the first and second calibration currents.

Example 30 includes the apparatus of Example 29, wherein the calibration controller has a voltage sensing input and is further configured to receive a plurality of voltage signals at the voltage sensing input, determine a voltage angle based on the plurality of voltage signals, and provide the PWM control signal based on the voltage angle.

Example 31 is a computer program product including one or more non-transitory machine-readable mediums encoded with instructions that when executed by one or more processors cause the one or more processors to: receive data corresponding to a sensor signal from a sensor proximate a first conductor, the sensor signal representing a measurement of a magnetic field produced based on a first current flowing in the first conductor and a second current flowing in a second conductor, the first current including a first current component having a particular frequency and a second current component having a different frequency from the first current component, and the second current including a third current component having the particular frequency and phase shifted from the first current component and a fourth current component having a different frequency from the third current component, determine a reference value of the first current, determine a reference value of the second current, and based on the sensor signal and the reference values of the first and second currents, determine for the sensor, a plurality of coupling coefficients representing magnetic field coupling between the sensor and the first and second conductors.

Example 32 includes the computer program product of Example 31, wherein the instructions further comprise instructions that when executed by the one or more processors cause the one or more processors to cause generation of at least one control signal to produce the second and fourth current components.

Example 33 includes the computer program product of one of Examples 31 and 32, wherein to cause generation of the at least one control signal, the instructions further comprise instructions that when executed by the one or more processors cause the one or more processors to cause generation of a first pulse width modulation (PWM) control signal to produce the second current component, and cause generation of a second PWM control signal to produce the fourth current component.

Example 34 includes the computer program product of Example 33, wherein the instructions further comprise instructions that when executed by the one or more processors cause the one or more processors to receive data corresponding to a voltage measurement signal, determine a voltage angle based on the voltage measurement signal, and cause generation of the first and second PWM control signals based at least in part on the voltage angle.

Example 35 includes the computer program product of any one of Examples 31-34, wherein the second and fourth current components have a same frequency, a same phase, and a sample amplitude.

Modifications are possible in the described examples, and other examples are possible, within the scope of the claims.

The invention claimed is:

1. An apparatus comprising:
an inverter having a current terminal and at least one control terminal;
a sensor module including at least one sensor and configured to provide a sensor signal representative of a measurement of a magnetic field produced based on multi-phase current signals present at the current terminal; and
a controller having a voltage sensing input, a current sensing input coupled to the sensor module, and a control output coupled to the at least one control terminal, the controller configured to:
determine a voltage angle based on voltage measurements received at the voltage sensing input,
receive, at the current sensing input, the sensor signal, and
provide, based on the voltage angle and a reference measurement of the multi-phase current signals, a pulse width modulation (PWM) control signal at the control output to control the inverter to produce a calibration current signal at the current terminal, the calibration current signal having a first frequency, wherein the multi-phase current signals include a combination of multi-phase drive currents and the calibration current signal, the multi-phase drive currents having a second frequency different from the first frequency.

2. The apparatus of claim 1, wherein the controller further includes a data input configured to receive the reference measurement.

3. The apparatus of claim 2, wherein the data input includes an I2C interface.

4. The apparatus of claim 1, wherein the controller is further configured to:
determine, based on the sensor signal and the reference measurement, a plurality of coupling coefficients for the at least one sensor.

5. The apparatus of claim 4, wherein the sensor module includes a data input, wherein the controller includes a data output coupled to the data input of the sensor module, and wherein the controller is configured to provide the plurality of coupling coefficients to the sensor module via the data output.

6. The apparatus of claim 5, wherein the data output of the controller and the data input of the sensor module are configured as I2C interfaces.

7. The apparatus of claim 1, wherein the controller comprises at least one reference current sensor configured to provide the reference measurement of the multi-phase current signals.

8. An apparatus comprising:
a sensor having a sensor output and configured to provide a sensor signal at the sensor output; and
a controller having a sensor input coupled to the sensor output, a data input, and a control output, the controller configured to:
receive the sensor signal via the sensor input,
receive, at the data input, data representing a measurement of a first calibration current and a measurement of a second calibration current,
determine, based on the sensor signal and the measurements of the first and second calibration currents, a plurality of coupling coefficients for the sensor, and
calibrate an output signal of the sensor that is representative of a magnetic field using the plurality of coupling coefficients to generate a current measurement signal.

9. The apparatus of claim 8, wherein the sensor signal is representative of a magnetic field produced by the first and second calibration currents.

10. The apparatus of claim 8, wherein the data input is an I2C interface.

11. The apparatus of claim 8, wherein the first calibration current includes a first current component having a particular frequency and a second current component having a different frequency from the first current component, and the second calibration current includes a third current component having the particular frequency and phase shifted from the first current component and a fourth current component having a different frequency from the third current component.

12. The apparatus of claim 11, wherein the second and fourth current components have a same frequency, a same amplitude, and a same phase.

* * * * *